United States Patent
Suzuki

(10) Patent No.: US 8,803,621 B2
(45) Date of Patent: Aug. 12, 2014

(54) SEMICONDUCTOR DEVICE HAVING OSCILLATOR CIRCUIT

(75) Inventor: Sanae Suzuki, Kanagawa (JP)

(73) Assignee: Renesas Electronics Corporation, Kawasaki-shi, Kanagawa (JP)

(*) Notice: Subject to any disclaimer, the term of this patent is extended or adjusted under 35 U.S.C. 154(b) by 15 days.

(21) Appl. No.: 13/620,997

(22) Filed: Sep. 15, 2012

(65) Prior Publication Data

US 2013/0069732 A1    Mar. 21, 2013

(30) Foreign Application Priority Data

Sep. 15, 2011   (JP) .................................. 2011-201303

(51) Int. Cl.
| | |
|---|---|
| H03B 5/04 | (2006.01) |
| H03B 5/36 | (2006.01) |
| H03L 1/00 | (2006.01) |
| H03L 5/00 | (2006.01) |

(52) U.S. Cl.
CPC .................. *H03B 5/04* (2013.01); *H03B 5/364* (2013.01); *H03L 1/00* (2013.01); *H03L 5/00* (2013.01)
USPC .................... 331/116 FE; 331/109; 331/158; 331/183; 331/186

(58) Field of Classification Search
CPC .............. H03B 5/04; H03B 5/30; H03B 5/32; H03B 5/36; H03B 5/364; H03B 2202/042; H03L 1/00; H03L 5/00; H03L 5/02
USPC ........... 331/109, 116 FE, 116 M, 116 R, 154, 331/158, 160, 182, 183, 185, 186
See application file for complete search history.

(56) References Cited

U.S. PATENT DOCUMENTS

| | | | | |
|---|---|---|---|---|
| 4,307,354 | A * | 12/1981 | Miyagawa et al. | 331/116 FE |
| 6,278,338 | B1 * | 8/2001 | Jansson | 331/116 FE |
| 6,759,914 | B2 * | 7/2004 | Rusznyak | 331/116 FE |
| 7,042,299 | B2 * | 5/2006 | Tachibana et al. | 331/158 |
| 7,088,196 | B2 * | 8/2006 | Ashida et al. | 331/158 |
| 7,336,138 | B2 * | 2/2008 | Kitamura et al. | 331/186 |
| 7,683,728 | B2 * | 3/2010 | Maede | 331/116 FE |
| 8,102,217 | B2 * | 1/2012 | Aoki | 331/160 |
| 8,120,437 | B2 * | 2/2012 | Watanabe | 331/158 |

FOREIGN PATENT DOCUMENTS

JP         2005-159786 A        6/2005

* cited by examiner

*Primary Examiner* — Levi Gannon
(74) *Attorney, Agent, or Firm* — McDermott Will & Emery LLP

(57) ABSTRACT

An oscillation circuit section is provided which can attain the reduction of a consumed power amount and the reduction of a manufacturing cost. In a semiconductor device, voltages are generated to drive the oscillation circuit section by using a plurality of MOS transistors which are connected in serial and each of which is in a diode connection. At this time, each voltage is generated based on a power supply voltage and a ratio of the threshold voltages of the plurality of MOS transistors. Therefore, it is possible to suppress the threshold voltage of each MOS transistor, to save an area of each MOS transistor, and to reduce the consumed power amount of the oscillation circuit section.

7 Claims, 10 Drawing Sheets

SEMICONDUCTOR DEVICE HAVING OSCILLATOR CIRCUIT

CROSS REFERENCE

This patent application claims a priority on convention based on Japanese Patent Application No. JP 2011-201303. The disclosure thereof is incorporated herein by reference.

TECHNICAL FIELD

The present invention is related to a semiconductor device, and especially, to a semiconductor device which has an oscillation circuit.

BACKGROUND ART

Miniaturization proceeds in a mobile information terminal and a DSC (Digital Still Camera) and so on. With the miniaturization of the terminal, a battery is also miniaturized, and a case where a button cell of a small capacity is used is increasing. For this reason, a low consumed power amount is required even to an oscillation circuit which always operates inside the LSI (Large Scale Integration).

As a method of supplying power to such an oscillation circuit, a conventional technique is known in which a power supply voltage from a constant voltage circuit is lowered to a constant voltage, and the lowered voltage is supplied to the oscillation circuit. However, in such a conventional technique, as the voltage lowering width is increased, a resistance element having a higher resistance value is required. When the resistance element has the higher resistance value, a wider area is required for the resistance element in the LSI.

Therefore, the saving an occupation area in the LSI and the low consumed power amount are required.

In conjunction with the above, an oscillation circuit is disclosed in Patent Literature 1 (JP 2005-159786A). This oscillation circuit has as an object, to reduce consumption current. This oscillation circuit is provided with a functional section which restrains a supply voltage to an oscillation gate. This oscillation circuit restrains a voltage by using a threshold voltage of a transistor in a diode connection.

FIG. 1 is a circuit diagram showing the configuration of the oscillation circuit according to Patent Literature 1. Components of the oscillation circuit shown in FIG. 1 will be described. This oscillation circuit is provided with an oscillation gate circuit section 120, first and second amplitude restraining circuits 151 and 152, an amplitude amplifying circuit 109, an input side capacitor C101, an output side capacitor C102, a feedback resistance 103 and a resonator 104. The oscillation gate circuit section 120 is provided with a PMOS transistor 101 and an NMOS transistor 102. The first amplitude restraining circuit 151 is provided with a PMOS transistor 107. The first amplitude restraining circuit 151 is further provided with a diode 130, another PMOS transistor 132 and a first current source 134 and so on, but the description of these elements is omitted. The second amplitude restraining circuit 152 is provided with an NMOS transistor 108. The second amplitude restraining circuit 152 is further provided with a second diode 131, another NMOS transistor 133 and a second current source 135 and so on, but the description of these components is omitted. The amplitude amplifying circuit 109 is provided with a PMOS transistor 111 and an NMOS transistor 112.

The connection relation of the components of the oscillation circuit shown in FIG. 1 will be described. A source of the PMOS transistor 107 is connected with a power supply VCC. A gate and drain of the PMOS transistor 107 are connected with the source of the PMOS transistor 101 in common. The gate of the PMOS transistor 101 is connected with the gate of the NMOS transistor 102, one of the ends of the feedback resistance 103, one of the ends of the resonator 104, and one of the ends of the input side capacitor C101 in common. The drain of the PMOS transistor 101 is connected with the drain of the NMOS transistor 102, the other end of the feedback resistance 103, the other end of the resonator 104, one of the ends of the output side capacitor C102, a gate of the PMOS transistor 111 and a gate of the NMOS transistor 112 in common. A source of the NMOS transistor 102 is connected with the gate and drain of the NMOS transistor 108 in common. The source of the NMOS transistor 108 is grounded. The other end of the input side capacitor C101 is grounded. The other end of the output side capacitor C102 is grounded. The source of the PMOS transistor 111 is connected with the power supply VCC. The drain of the PMOS transistor 111 is connected with the drain of the NMOS transistor 112 and an output section CKOUT in common. The source of the NMOS transistor 112 is grounded.

An operation of the oscillation circuit shown in FIG. 1 will be described. In the first amplitude restraining circuit 151, the PMOS transistor 107 has the gate and the drain connected in the so-called "diode connection". Therefore, the voltage of the drain of the PMOS transistor 107 is equal to a voltage lowered by the threshold voltage of the PMOS transistor 107 from the power supply voltage VCC. Hereinafter, the threshold voltage of the PMOS transistor 107 is referred to as Vt107.

In a same way, the NMOS transistor 108 is in a diode connection in the second amplitude restraining circuit 152. Therefore, the voltage of the drain of the NMOS transistor 108 is equal to a voltage arisen from the ground voltage by the threshold voltage of the NMOS transistor 108. Hereinafter, the threshold voltage of the NMOS transistor 108 is referred to as Vt108.

In the oscillation gate circuit section 120, the PMOS transistor 101 and the NMOS transistor 102 are connected in serial between the drain of the PMOS transistor 107 of the first amplitude restraining circuit 151 and the drain of the NMOS transistor 108 of the second amplitude restraining circuit 152. Therefore, an oscillation signal generated by the oscillation gate circuit section 120 has the amplitude between the voltage lower by threshold voltage Vt107 than power supply voltage VCC and the voltage higher by the threshold voltage Vt108 than the ground voltage.

Here, an output signal of the oscillation gate circuit section 120 is fed back to the input side through the feedback resistance 103 and the resonator 104 to be oscillated. It should be noted that when the oscillation signal of the oscillation gate circuit section 120 is generated, a charging operation and a discharging operation are performed in the input side capacitor C101 and the output side capacitor C102. The current which accompanies the charging/discharging operations is consumed in the oscillation circuit. In Patent Literature 1, the consumed power amount of the oscillation circuit is reduced by making the amplitude of the oscillation signal small.

CITATION LIST

[Patent Literature 1] JP 2005-159786A

SUMMARY OF THE INVENTION

There is a problem that the operation of a transistor is influenced by a process deviation when the transistor is manufactured, in the oscillation circuit of Patent Literature 1. There are two kinds of process deviation.

In a first kind, the process deviation occurs such that the threshold voltages of the PMOS transistor and the NMOS transistor become higher than design values. At this time, the amplitude of the oscillation signal generated by the oscillation gate circuit section 120 becomes larger than the design value. Also, the driving ability of the oscillation gate circuit section 120 becomes smaller than a design value. Therefore, in the first kind of process deviation, in the oscillation gate circuit section 120, it is desirable that the voltage between the source of the PMOS transistor 101 and the source of the NMOS transistor 102 is larger.

Next, in a second kind, the process deviation occurs such that the threshold voltages of the PMOS transistor and the NMOS transistor become smaller than design values. At this time, the amplitude of the oscillation signal generated by the oscillation gate circuit section 120 becomes smaller than a design value. Also, the driving ability of the oscillation gate circuit section 120 becomes larger than a design value. Therefore, in the second kind of process deviation, in the oscillation gate circuit section 120, it is desirable that the voltage between the source of the PMOS transistor 101 and the source of the NMOS transistor 102 is smaller.

However, in case of manufacturing a transistor, it is impossible to estimate the direction of the process deviation. Therefore, it is necessary to secure a sufficient margin at the design stage such that a voltage range in which the oscillation gate circuit section 120 can surely operate is secured even if the process deviation occurs in any direction. As a result, in the oscillation gate circuit section 120, the voltage range between the source of the PMOS transistor 101 and the source of the NMOS transistor 102 contains a margin which does not contribute to the reduction of the consumed power amount.

Also, the threshold voltage of the MOS transistor in the diode connection is about 0.6V to 0.7V. In order to get the larger threshold voltage, it is required that the gate length L of the MOS transistor is made long and the drain-source current IDS which flows between the drain and the source is made small. However, the current IDS is proportional to a reciprocal of the gate length L. FIG. 5 is a graph showing the relation of gate length L and drain-source current IDS in general MOS transistor. In case of the oscillation circuit of Patent Literature 1, in order to get the current IDS which is sufficiently small, it would be necessary to increase the gate length L to tens of μm (micrometers). To use the MOS transistor which has such a gate length L is one of causes that the area of the oscillation circuit becomes large. In this way, the oscillation circuit of Patent Literature 1 can not attain the reduction of a consumed power amount and the reduction of a manufacturing cost simultaneously.

In an aspect of the embodiment, a semiconductor device includes: a first power supply section configured to supply a first power supply voltage; a second power supply section configured to supply a second power supply voltage; an amplitude control circuit section configured to receive the first and second power supply voltages and generate first and second supply voltages; and an oscillation circuit section configured to receive the first and second supply voltages from first and second input sections to carry out an oscillation. The amplitude control circuit section includes: a plurality of MOS transistors, which are connected in serial between the first and second power supply sections, and each of which is in a diode connection; a first output section connected with one of the plurality of MOS transistors to output the first supply voltage; and a second output section connected with another of the plurality of MOS transistors to output the second supply voltage.

According to the semiconductor device of the present invention, by using a plurality of MOS transistors, each of which is in a diode connection and which are connected in serial, a voltage is generated to drive an oscillation circuit section. At this time, the voltage generated by the plurality of MOS transistors is obtained based on a power supply voltage and a ratio of the threshold voltages of the MOS transistors. Therefore, it is possible to restrain on the area of each MOS transistor, to reduce the threshold voltage of each MOS transistor, and to reduce a consumed power amount of the oscillation circuit section.

DESCRIPTION OF EMBODIMENTS

Hereinafter, a semiconductor device according to embodiments of the present invention will be described in detail with reference to the attached drawings.

First Embodiment

Figure 2:
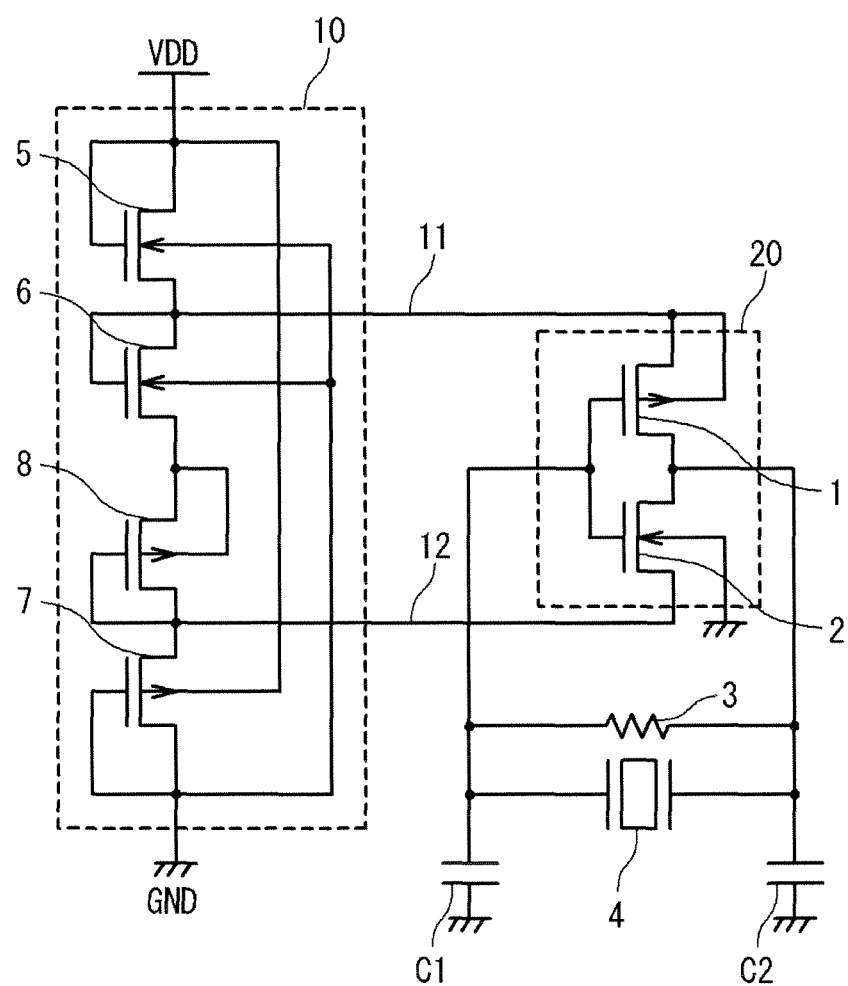
FIG. 2 is a circuit diagram showing the configuration of a semiconductor device according to a first embodiment of the present invention.

FIG. 2 is a graphic diagram showing the configuration of the semiconductor device according to a first embodiment of the present invention. Components of the semiconductor device shown in FIG. 2 will be described. The semiconductor device shown in FIG. 2 is provided with a power supply voltage VDD, a ground GND, an amplitude control circuit section 10, an oscillation gate circuit section 20, a feedback resistance 3, a resonator 4, an input side capacitor C1 and an output side capacitor C2. The amplitude control circuit section 10 is provided with first and second NMOS transistors 5 and 6, and first and second PMOS transistors 7 and 8. The oscillation gate circuit section 20 is provided with a PMOS transistor 1 and an NMOS transistor 2. Here, the oscillation gate circuit section 20, the feedback resistance 3, the resonator 4, the input side capacitor C1 and the output side capacitor C2 may be collectively referred to as an oscillation circuit section.

The connection relation of the components of the semiconductor device shown in FIG. 2 will be described. The power supply voltage VDD is connected with a drain and gate of the first NMOS transistor 5, and a back gate of the first PMOS transistor 7 in common. An output section 11 is connected with a source of the first NMOS transistor 5, a drain and gate of the second NMOS transistor 6, and a source and a back gate of the PMOS transistor 1 in common. An output section 12 is connected with a source of the first PMOS transistor 7, a drain and gate of the second PMOS transistor 8, and a source of the NMOS transistor 2 in common. A source of the second NMOS transistor 6 is connected with a source and a back gate of the second NMOS transistor 8 in common. A back gate of the first NMOS transistor 5, a back gate of the second NMOS transistor 6, a gate of the first PMOS transistor 7, a back gate of the NMOS transistor 2, one of ends of the input side capacitor C1 and one of ends of the output side capacitor C2 are grounded. The other end of the input side capacitor C1 is connected with the gate of the PMOS transistor 1, the gate of the NMOS transistor 2 and one of ends of the feedback resistance 3 and one of ends of the resonator 4 in common. The other end of the output side capacitor C2 is connected with the drain of the PMOS transistor 1, the drain of the NMOS transistor 2, the other end of the feedback resistance 3 and the other end of the resonator 4 in common.

An operation of the semiconductor device shown in FIG. 2 will be described. First, the operations of the oscillation gate circuit section 20, the input side capacitor C1, the output side capacitor C2, the feedback resistance 3 and the resonator 4 are same as those of the above-mentioned technique but the description will be made once again.

The power supply voltage VDD functions as a first power supply section which supplies a first power supply voltage VDD. In the same way, the ground GND functions as a second power supply section which supplies a reference voltage as a second power supply voltage. In the oscillation gate circuit section 20, the PMOS transistor 1 and the NMOS transistor 2 are connected in serial between the output section 11 and the output section 12. Therefore, an oscillation signal generated by the oscillation gate circuit section 20 has a voltage between a voltage at the output section 11 and a voltage at the output section 12. Here, the output section 11 and the output section 12 function as first and second input sections of the oscillation gate circuit section 20. Also, an output signal of the oscillation gate circuit section 20 is fed back to the input side through the feedback resistance 3 and the resonator 4, so as to attain the oscillation. It should be noted that when the oscillation signal is generated in the oscillation gate circuit section 20, a charging operation and a discharging operation are performed in the input side capacitor C1 and the output side capacitor C2. The current which accompanies the charging and discharging operations is consumed as consumption power of the oscillation circuit.

Next, an operation of the MOS transistor in a diode connection will be described. A connection in which the gate of the MOS transistor is connected with the drain of the MOS transistor is referred to as a diode connection. In the MOS transistor in the diode connection, a gate-source voltage VGS is a threshold voltage Vt just as it is. In the semiconductor device of FIG. 2, the first and second NMOS transistors 5 and 6, and the first PMOS transistor 7 are in the diode connection. Therefore, the threshold voltages Vt5 to Vt7 of the MOS transistors 5 to 7 are equal to the gate-source voltages VGS5 to VGS7 of the MOS transistors 5 to 7, respectively.

In the MOS transistor, the current is difficult to flow from the source to the drain when an absolute value of the back gate-source voltage VBS is equal to or more than zero. In this case, the threshold voltage Vt of the MOS transistor becomes higher than a case that back gate-source voltage VBS is equal to zero. In the semiconductor device shown in FIG. 2, because the back gate of the PMOS transistor 8 is connected with the source of the PMOS transistor 8 although the second PMOS transistor 8 is in the diode connection, the back gate-source voltage VBS is equal to zero. Therefore, the threshold voltage Vt8 of the second PMOS transistor 8 is lower than the threshold voltages Vt5 to Vt7 of the other MOS transistors 5 to 7.

Next, the operation until the oscillation of the semiconductor device shown in FIG. 2 starts will be described. First, in an initial state, all the transistors are in an off state. Because the gate of the first NMOS transistor 5 is connected with the power supply voltage VDD, a drain-source current (hereinafter, to be referred to as "IDS") is generated in response to the turn-on of the power supply. Because a voltage is applied to the drain and gate of the second NMOS transistor 6, the current IDS is generated. A voltage is applied to the source of the second PMOS transistor 8. In the first PMOS transistor 7, a voltage is applied to the source. Here, because a gate is connected with the drain and the gate voltage is lower than the source voltage, the current IDS is generated. Because all of the transistors contained in the amplitude control circuit section 10 are in the diode connection, the MOS transistors 5 to 8 should operate originally with threshold voltages Vt5 to Vt8. However, these four MOS transistors 5 to 8 are connected in serial and the power supply voltages VDD and GND are applied to the both ends. Therefore, the drain-source voltages VDS5 to VDS8 of the MOS transistors 5 to 8 contained in the amplitude control circuit 10 are determined based on the power supply voltage VDD and a ratio of the threshold voltages Vt5 to Vt8 of these MOS transistors 5 to 8. Specifically, the actual drain-source voltages VDS5 to VDS8 of the MOS transistors 5 to 8 are determined from the following equations based on a ratio of original threshold voltages Vt5 to Vt8:

$$VDS5 = VDD \times Vt5/(Vt5+Vt6+Vt7+Vt8)$$

$$VDS6 = VDD \times Vt6/(Vt5+Vt6+Vt7+Vt8)$$

$$VDS7 = VDD \times Vt7/(Vt5+Vt6+Vt7+Vt8)$$

$$VDS8 = VDD \times Vt8/(Vt5+Vt6+Vt7+Vt8)$$

The voltage V11 at the output section 11 and the voltage V12 at the output section 12 are determined from the following equations and the above drain-source voltages VDS5 to VDS8 of the MOS transistors 5 to 8:

$$V11 = VDD \times (Vt6+Vt7+Vt8)/(Vt5+Vt6+Vt7+Vt8)$$

$$V12 = VDS7 = VDD \times Vt7/(Vt5+Vt6+Vt7+Vt8)$$

Supposing that a difference between the voltages V11 and V12 at the output sections 11 and 12 is shown by a drive voltage ΔV, $$\Delta V = V11 - V12 = VDD \times (Vt6+Vt8)/(Vt5+Vt6+Vt7+Vt8)$$

By applying the above-mentioned drive voltage ΔV to the two MOS transistors 1 and 2 contained in the oscillation gate circuit section 20, the oscillation gate circuit section 20 starts the oscillation operation.

It should be noted that the output section 11 and the output section 12 function as the first and second output sections from which the amplitude control circuit section 10 outputs the first and second voltages V11 and V12.

If the back gate of the second PMOS transistor 8 is connected with the power supply voltage VDD, the threshold voltage Vt8 of the transistor 8 becomes larger than a case of being not connected like FIG. 2. As a result, the ratio of the threshold voltages Vt5 to Vt8 of the four transistors 5 to 8 contained in the amplitude control circuit section 10 changes. Specifically, the voltage V11 at the output section 11 becomes high, the voltage V12 at the output section 12 becomes lower, and the drive voltage ΔV as the difference becomes high.

In other words, by connecting the back gate of the second PMOS transistor 8 to the source like FIG. 2, the drive voltage ΔV can be reduced lower in the semiconductor device of the present embodiment.

The power supply to the oscillation gate circuit section 20 is performed through the voltage V11 at the output section 11 which is lowered from the power supply voltage VDD and the voltage V12 at the output section 12 which is raised from the ground reference voltage GND. Therefore, the output waveform of the oscillation gate circuit section 20 is settled in a small range between the voltage V11 at the output section 11 and the voltage V12 at the output section 12, in the maximum amplitude after the oscillation has been grown to the steady state. Therefore, the current for charging and discharging the input side capacitor C1 and the output side capacitor C2 can be reduced. Consequently, the consumed power as the whole oscillator circuit can be reduced.

Here, a problem of a deviation in the semiconductor process will be considered. In the actually manufactured semiconductor device, the threshold voltages Vt of the transistors are generally varied every product. The deviation influences the voltages supplied to the oscillation gate circuit section directly in the conventional technique, but the influence of this deviation becomes small in the present invention.

Figure 1:
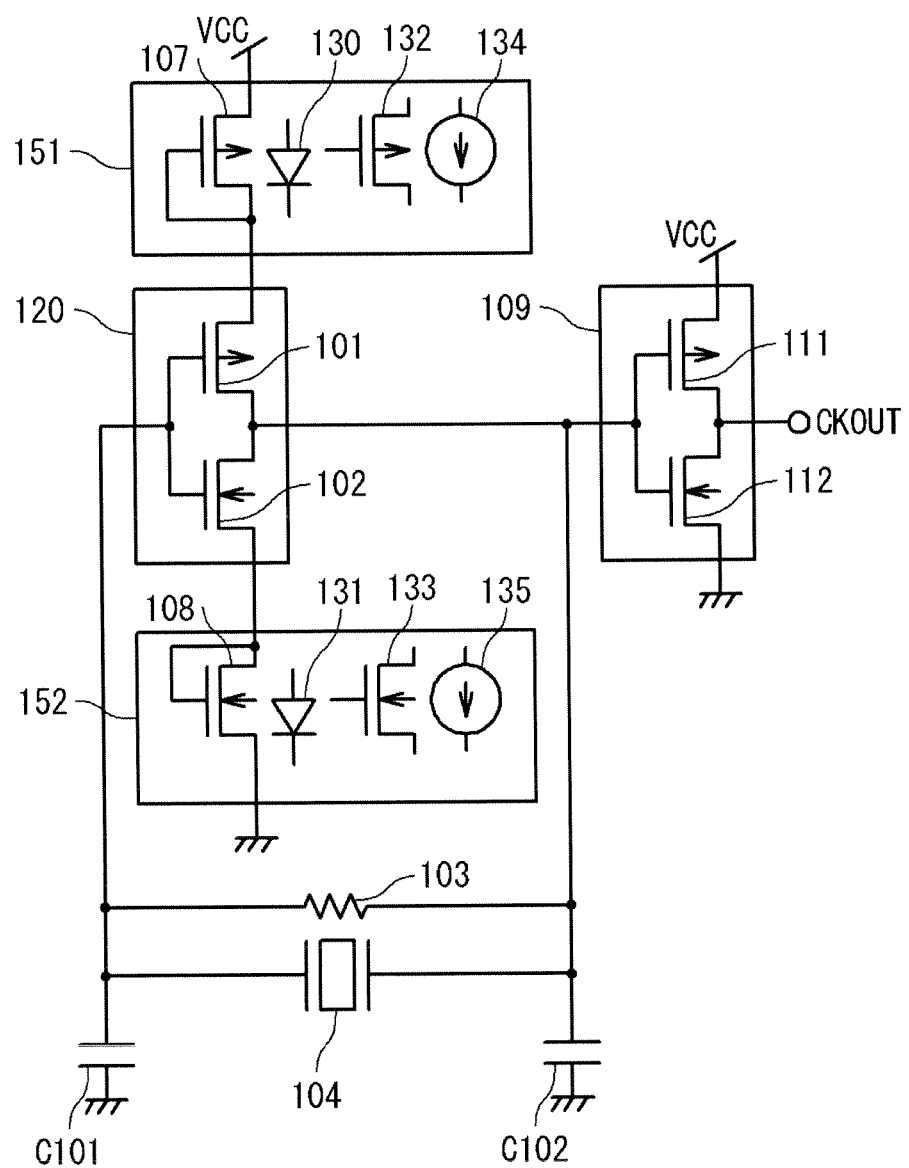
FIG. 1 is a circuit diagram showing a configuration of a general oscillation circuit in a semiconductor device.

In case of the conventional technique shown in FIG. 1, the voltage which is supplied to the oscillation gate circuit section 120 is equal to the difference of the voltage on the high side supplied from the PMOS transistor 107 and the voltage on the low side supplied from the NMOS transistor 108. Here, the PMOS transistor 107 is in the diode connection and the source thereof is connected with the power supply VCC. Therefore, the voltage on the high side is equal to a voltage which is lower by the threshold voltage Vt of the PMOS transistor 107 than the power supply voltage VCC. In the same way, the NMOS transistor 108 is in the diode connection and the source is grounded. Therefore, the voltage on the low side is equal to the voltage which is higher by the threshold voltage Vt of the NMOS transistor 108 than the ground reference voltage. In such a configuration, the voltage which is supplied to the oscillation gate circuit section 120 has undergone the influence of the manufacturing deviation directly, i.e. it has been deviated at the same ratio as the manufacturing deviation.

However, in the semiconductor device of the present embodiment, even if the manufacturing deviation occurs to the threshold voltages Vt5 to Vt8 of the MOS transistors 5 to 8 connected in serial, the ratio does not sometimes change. This is because it is expected that the manufacturing deviation is similar over the plurality of transistors formed in the comparatively near places on a same semiconductor substrate. In this case, because the drive voltage ΔV supplied to the oscillation gate circuit section 20 is determined based on the ratio of the threshold voltages, the semiconductor device does not undergo the influence of manufacturing deviation.

On the other hand, the manufacturing deviation sometimes acts in opposite directions in the NMOS transistor and the PMOS transistor. In this case, the ratio of the threshold voltages Vt5 to Vt8 of the MOS transistors 5 to 8 connected in serial has changed. Therefore, in this case, the drive voltage ΔV supplied to the oscillation gate circuit section 20 has undergone the influence of manufacturing deviation.

In this case, however, the PMOS transistor 1 and the NMOS transistor 2 contained in the oscillation gate circuit section 20 undergo the influence of manufacturing deviation in the opposite directions like the MOS transistors 5 to 8. That is, the voltage supplied to the oscillation gate circuit section 20 undergoes the influence of manufacturing deviation, like the drive voltage ΔV supplied from the amplitude control circuit section 10. Therefore, the semiconductor device according to the present embodiment does not need a surplus margin when considering the manufacturing deviation. As a result, the extra consumed power amount related to the margin, which is needed in the conventional technique, can be reduced in the present invention.

It should be noted that even if the channel polarity is exchanged and the order of the MOS transistors 5 to 8 is changed, the same operation and effect as in the above examples can be attained originally.

As described above, in the semiconductor device of the present embodiment, the drive voltage ΔV supplied to the oscillation gate circuit section 20 is determined based on the ratio of the threshold voltages Vt5 to Vt8 of the plurality of MOS transistors 5 to 8. Therefore, it is not required to increase the effective threshold voltages Vt5 to Vt8 of the MOS transistors 5 to 8, unlike the conventional technique. As a result, it is possible to save a layout area of the whole semiconductor device.

Figure 3A:
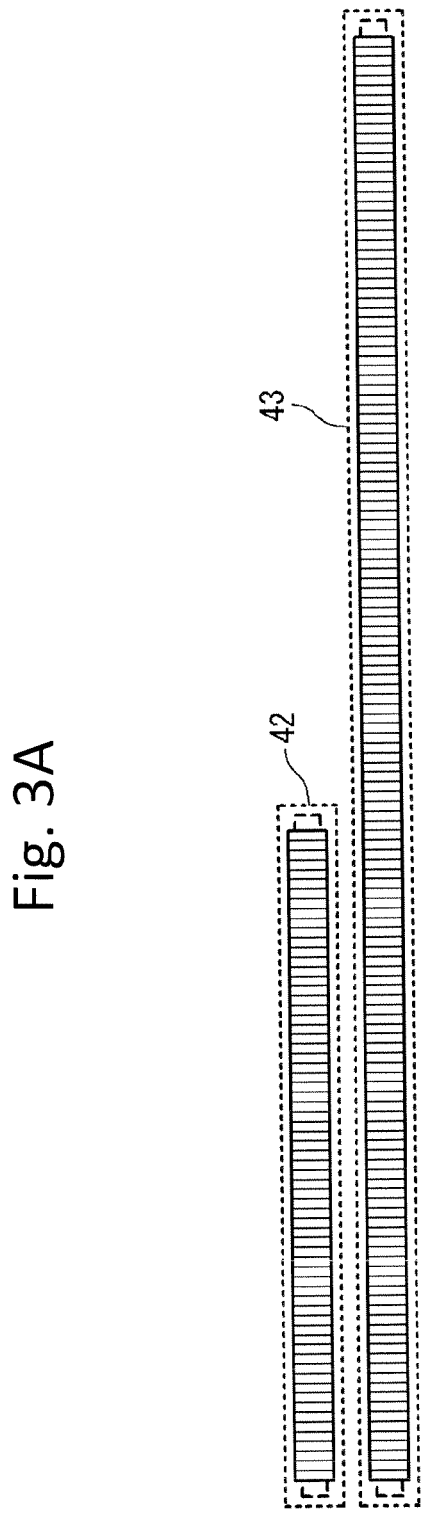
FIG. 3A is an example of a layout diagram of a MOS transistor group in the general semiconductor device.
Figure 3B:
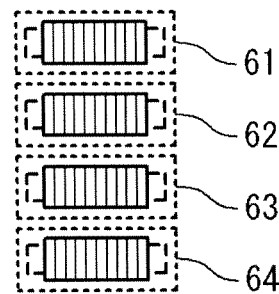
FIG. 3B is an example of a layout diagram of a MOS transistor group in the semiconductor device according to the first embodiment of the present invention.

FIG. 3A is an example of the layout diagram of a MOS transistor group of the semiconductor device in the conventional technique. FIG. 3B is an example of the layout diagram of the MOS transistor group in the semiconductor device according to the first embodiment of the present invention. Referring to FIG. 3A and FIG. 3B, it will be described that the semiconductor device of the present invention can reduce the layout area of the MOS transistors.

The PMOS transistor 42 and the NMOS transistor 43 are illustrated in FIG. 3A. The NMOS transistors 61 and 62 and the PMOS transistors 63 and 64 are illustrated in FIG. 3B. The PMOS transistor 42 of FIG. 3A is equivalent to the PMOS transistor 108 of FIG. 1. The NMOS transistor 43 of FIG. 3A is equivalent to the NMOS transistor 108 of FIG. 1. The NMOS transistor 61 of FIG. 3B is equivalent to the NMOS transistor 5 of FIG. 2. The NMOS transistor 62 of FIG. 3B is equivalent to the NMOS transistor 6 of FIG. 2. The PMOS transistor 63 of FIG. 3B is equivalent to the NMOS transistor 7 of FIG. 2. The PMOS transistor 64 of FIG. 3B is equivalent to the NMOS transistor 8 of FIG. 2. The reduced scales of all the MOS transistors illustrated in FIG. 3A and FIG. 3B are the same.

In the conventional technique shown in FIG. 1, in order to secure a sufficiently large threshold voltage Vt, it was necessary to increase the layout area of the MOS transistors, as shown in FIG. 3A. However, in case of the present invention shown in FIG. 2, because the ratio of the threshold voltages Vt is important, the layout area of the MOS transistor can be suppressed to a minimum as shown in FIG. 3B.

Figure 4A:
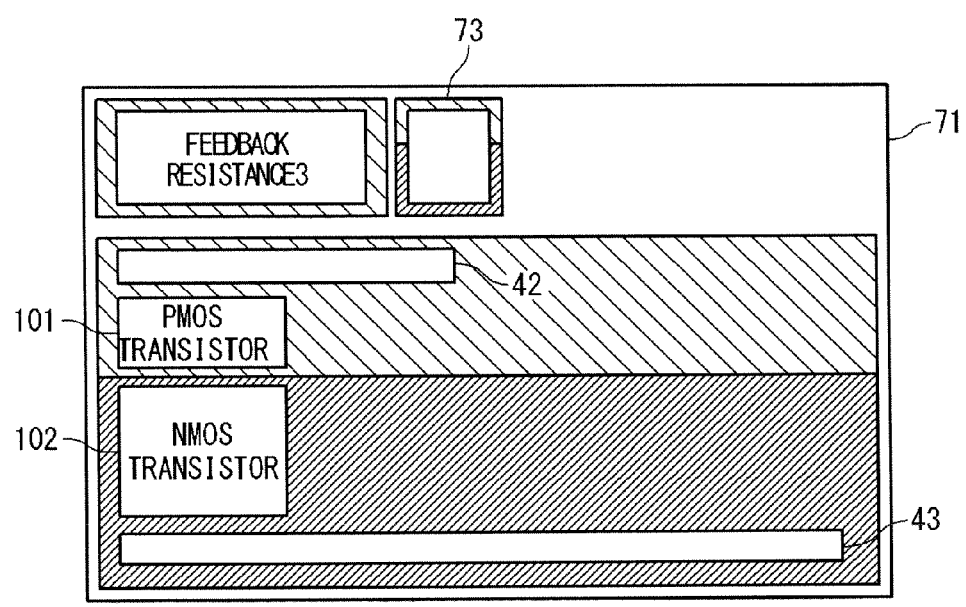
FIG. 4A is an example of an overall layout diagram of the general semiconductor device.
Figure 4B:
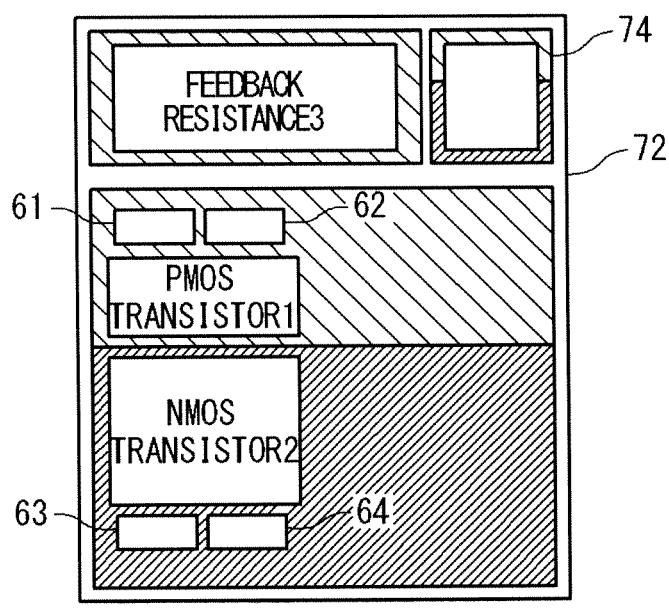
FIG. 4B is an example of an overall layout diagram of the semiconductor device according to the first embodiment of the present invention.

FIG. 4A is an example of the overall layout diagram of the semiconductor device in the conventional technique. FIG. 4B is an example of the overall layout diagram of the semiconductor device according to the first embodiment of the present invention. Referring to FIG. 4A and FIG. 4B, in the semiconductor device of the present invention, it will be described that it is possible to largely reduce the overall layout area.

The layout of a semiconductor device 71 is illustrated in FIG. 4A. The semiconductor device 71 contains PMOS transistors 42, NMOS transistors 43, a PMOS transistor 101, an NMOS transistor 102, a feedback resistance 103 and a circuit section 73. The PMOS transistors 42 of FIG. 4A are equivalent to the PMOS transistors 107 and 132 of FIG. 1. The NMOS transistors 43 of FIG. 4A is equivalent to the NMOS transistors 1108 and 133 of FIG. 1. The PMOS transistor 101 of FIG. 4A is equivalent to the PMOS transistor 101 of FIG. 1. The NMOS transistor 102 of FIG. 4A is equivalent to the NMOS transistor 102 of FIG. 1. The feedback resistance 103 of FIG. 4A is equivalent to the feedback resistance 103 of FIG. 1. It is supposed that the circuit section 73 of FIG. 4A is equivalent to the other components of FIG. 1, such as the input side capacitor C101, the output side capacitor C102 and the resonator 104.

A layout of the semiconductor device 72 is illustrated in FIG. 4B. The semiconductor device 72 is provided with PMOS transistors 61 and 62, NMOS transistors 63 and 64, a PMOS transistor 1, an NMOS transistor 2, a feedback resistance 3 and a circuit section 74. The PMOS transistors 61 and 62 of FIG. 4B are equivalent to the PMOS transistors 7 and 8 of FIG. 2. The NMOS transistors 63 and 64 of FIG. 4B are equivalent to the NMOS transistors 5 and 6 of FIG. 2. The PMOS transistor 1 of FIG. 4B is equivalent to the PMOS transistor 1 of FIG. 2. The NMOS transistor 2 of FIG. 4B is equivalent to the NMOS transistor 2 of FIG. 2. The feedback resistance 3 of FIG. 4B is equivalent to the feedback resistance 3 of FIG. 2. It is supposed that the circuit section 74 of FIG. 4B is equivalent to the other components of FIG. 2, such as the input side capacitor C1, the output side capacitor C2, and the resonator 4.

Here, the reduced scales of the layouts of FIG. 4A and FIG. 4B are the same. However, the reason why the overall layout area of the semiconductor device 71 of FIG. 4A is nearly twice of the overall layout area of the semiconductor device 72 of FIG. 4B is in that the length of the NMOS transistor 43 is long. The length of the NMOS transistor 43 is one of causes that a dead space of a great part of the semiconductor device 71 is generated.

It should be noted that if the semiconductor device which has the same performance as the present embodiment is manufactured by use of the conventional technique shown in FIG. 1, tens of μm need to be secured as the length L of the NMOS transistor 43. This length L is required to secure an enough threshold voltage Vt and to suppress the drain-source current IDS.

Figure 5:
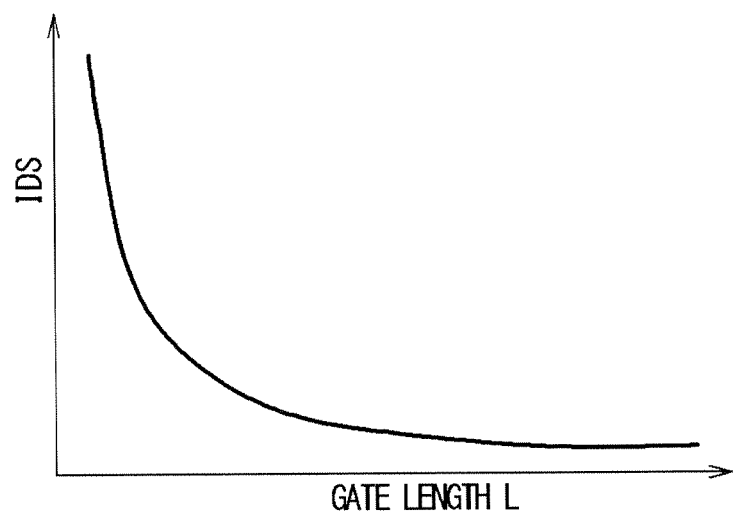
FIG. 5 is a graph showing relation between length L and drain-source current IDS in an NMOS transistor.

FIG. 5 is a graph schematically showing a relation between the length L and the drain-source current IDS of the NMOS transistor. In FIG. 5, the horizontal axis shows the length L of the NMOS transistor and the vertical axis shows drain-source current IDS. In order to suppress the drain-source current IDS, it is possible to read from the graph of FIG. 5 that the length L of the NMOS transistor needs to be secured to be large.

As described above, the semiconductor device according to the first embodiment of the present invention allows cost reductions such as reduction of the manufacturing cost with the reduction of the layout area and reduction of the consumed power amount.

Second Embodiment

Figure 6:
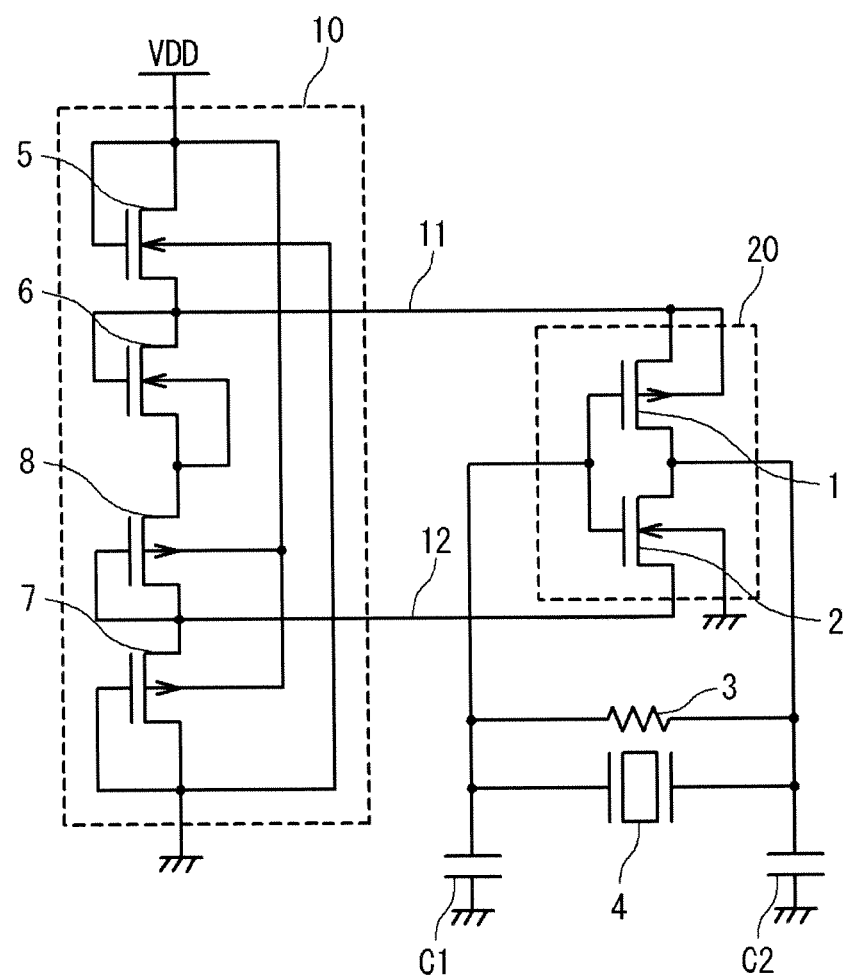
FIG. 6 is a circuit diagram showing the configuration of the semiconductor device according to a second embodiment of the present invention.

FIG. 6 is a diagram showing the configuration of the semiconductor device according to a second embodiment of the present invention. The semiconductor device in the present embodiment is attained by applying the following modifications to the semiconductor device according to the first embodiment of the present invention shown in FIG. 2. That is, in the semiconductor device of FIG. 2, the back gate of the second PMOS transistor 8 is connected with the source of the second PMOS transistor 8 and the source of the second NMOS transistor 6 in common. Also, in the semiconductor device of FIG. 2, the back gate of the second NMOS transistor 6 is grounded. However, in the semiconductor device of the present embodiment, the back gate of the second NMOS transistor 6 is connected with the source of the second PMOS transistor 8 and the source of the second NMOS transistor 6 in common. Also, in the semiconductor device of the present embodiment, the back gate of the second PMOS transistor 8 is grounded.

Because the other configuration of the semiconductor device of the present embodiment is the same as that of the first embodiment of the present invention shown in FIG. 2, the detailed description is omitted.

The semiconductor device of the present embodiment will be described. In the semiconductor device of the present embodiment, the threshold voltage Vt6 of the second NMOS transistor 6 becomes lower than the threshold voltages Vt5, Vt7, and Vt8 of the MOS transistors 5, 7, and 8. However, as a result, the drive voltage ΔV supplied to the oscillation gate circuit section 20 is the same as in the first embodiment of the present invention shown in FIG. 2.

Because the other operation and effect of the semiconductor device of the present embodiment are the same as those of the first embodiment of the present invention shown in FIG. 2, the detailed description is omitted.

Third Embodiment

Figure 7:
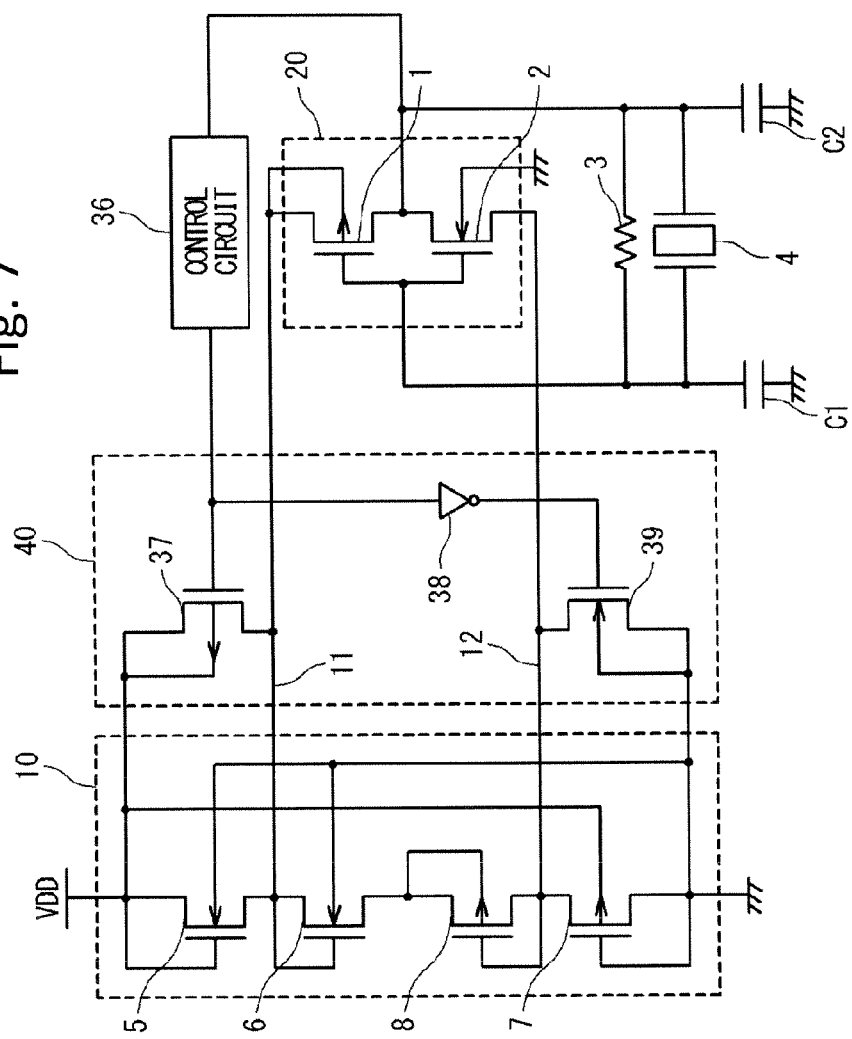
FIG. 7 is a circuit diagram showing the configuration of the semiconductor device according to a third embodiment of the present invention.

FIG. 7 is a circuit diagram showing the configuration of the semiconductor device according to a third embodiment of the present invention. The semiconductor device of FIG. 7 is attained by applying the following modifications to the semiconductor device according to the first embodiment of the present invention shown in FIG. 2. That is, a control circuit section 36 and a selector circuit section 40 are added.

An amplification factor of the oscillation circuit in which the circuit configuration containing a transistor size has been determined, changes according to the current flowing through the oscillation circuit (or, the voltage applied to the oscillation circuit). Generally, in the oscillation circuit, the amplification factor which is required to start the oscillation is higher than the amplification factor which is required to sustain the oscillation. In other words, when the current which flows through the oscillation gate circuit section 20 (or, the voltage which is applied to the oscillation gate circuit section 20) is too low due to some cause, there is a fear that the amplification factor of the oscillation gate circuit section 20 becomes low so that the oscillation does not start. In the present embodiment, it will be described that this problem can be solved by adding the control circuit section 36 and the selector circuit section 40.

The components of the semiconductor device shown in FIG. 7 will be described. The selector circuit section 40 is provided with a PMOS transistor 37, an inverter circuit section 38 and an NMOS transistor 39.

The connection relation of the components of the semiconductor device shown in FIG. 7 will be described. An input section of the control circuit section 36 is connected with the output section of the oscillation gate circuit section 20. An output section of the control circuit section 36 is connected with a gate of the PMOS transistor 37 and the input section of the inverter circuit section 38. An output section of the inverter circuit section 38 is connected with a gate of the NMOS transistor 39. A drain of the PMOS transistor 37 is connected with the output section 11. A source and back gate of the PMOS transistor 37 are connected with the power supply voltage VDD. A drain of the NMOS transistor 39 is connected with the output section 12. A source and back gate of the NMOS transistor 39 are grounded.

Because the other configuration of the semiconductor device shown in FIG. 7 is the same as that of the semiconductor device according to the first embodiment of the present invention shown in FIG. 2, the description is omitted.

The operation of the semiconductor device shown in FIG. 7 will be described. First, the control circuit section 36 outputs a logic signal based on an input signal. At this time, it is supposed that the output signal of the control circuit section 36 is in a low level in the initial state and changes to a high level after a predetermined time passes from appearance of the oscillation in the output signal of the oscillation gate circuit section 20. More specifically, a timer circuit and a counter circuit may be used as the control circuit section 36.

Next, the selector circuit section 40 receives the signal in the low level from the control circuit section 36 in the initial state. At this time, the PMOS transistor 37 is set to an ON state, and the voltage V11 at the output section 11 becomes equal to power supply voltage VDD. Also, the NMOS transistor 39 is set to an ON state through the inverter circuit section 38, and the voltage V12 at the output section 12 becomes equal to the ground reference voltage. That is, in the initial state, the power supply voltage VDD is supplied to the oscillation gate circuit section 20.

It should be noted that the PMOS transistor 37 operates as a first switch circuit section in which the drain-source path is turned on or off according to a voltage supplied to the gate thereof. In the same way, the NMOS transistor 39 operates as a second switch circuit section in which the drain-source path is turned on or off according to a voltage supplied to the gate thereof. Therefore, each of the PMOS transistor 37 and the NMOS transistor 39 can be replaced by the other configuration which can operate as a switch circuit section.

After that, when the predetermined time passes and the output signal of the control circuit section 36 changes to the high level, the PMOS transistor 37 and the NMOS transistor 39 are both turned off. At this time, the voltage V11 at the output section 11 and the voltage V12 at the output section 12 are determined by the amplitude control circuit section 10, like the first embodiment of the present invention.

As described above, according to the semiconductor device of the present embodiment, the voltage supplied to the oscillation gate circuit section 20 is in the high level in a first period and after that, is suppressed to the low level. As a result, it is possible to prevent a non-oscillation due to the lack of the drive power at the oscillation start of the oscillation gate circuit section 20 and to restrain the consumed power amount after the start of the oscillation.

Fourth Embodiment

Figure 8:
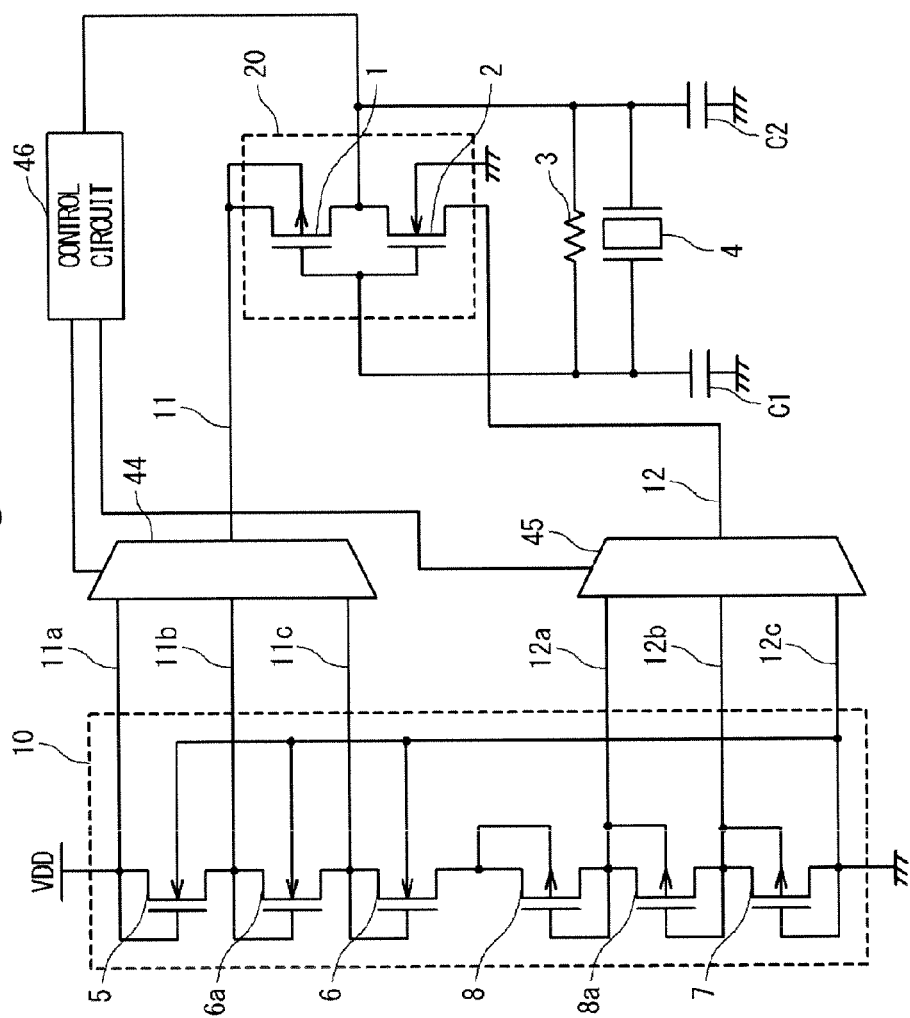
FIG. 8 is a circuit diagram showing the configuration of the semiconductor device according to a fourth embodiment of the present invention.

FIG. 8 is a circuit diagram showing the configuration of the semiconductor device according to a fourth embodiment of the present invention. The semiconductor device of the present embodiment is attained by applying the following modifications to the semiconductor device according to the first embodiment of the present invention shown in FIG. 2. That is, a control circuit section 46, and first and second selector circuit sections 44 and 45, and a third NMOS transistor 6a, a third PMOS transistor 8a and six output sections 11a, 11b, 11c, 12a, 12b and 12c. Here, the control circuit section 46 is provided with an input section, and first and second output sections. Also, each of the first and second selector circuit sections 44 and 45 is provided with first to third input sections, an output section and a control signal input section.

The connection relation of the components of the semiconductor device in the present embodiment will be described. The third NMOS transistor 6a is connected in serial between the first NMOS transistor 5 and the second NMOS transistor 6. That is, a drain of the third NMOS transistor 6a is connected with the source of the first NMOS transistor 5, and a source of the third NMOS transistor 6a is connected with the drain of the second NMOS transistor 6. Moreover, a gate of the third NMOS transistor 6a is connected with the drain of the third NMOS transistor 6a and the source of the first NMOS transistor 5 in common. The back gate of the third NMOS transistor 6a is grounded.

The third PMOS transistor 8a is connected in serial between the first PMOS transistor 7 and the second PMOS transistor 8. That is, a drain of the third PMOS transistor 8a is connected with the source of the first PMOS transistor 7, and a source of the third PMOS transistor 8a is connected with the drain of the second PMOS transistor 8. Moreover, the gate of the third PMOS transistor 8a is connected with the drain of the third PMOS transistor 8a and the source of the first PMOS transistor 7 in common. The back gate of the third PMOS transistor 8a is connected with the source of the third PMOS transistor 8a, and the gate and drain of the second PMOS transistor 8 in common.

An input section of the control circuit section 46 is connected with the output section of the oscillation gate circuit section 20. A first output section of the control circuit section 46 is connected with a control signal input section of the first the selector circuit section 44. A second output section of the control circuit section 46 is connected with the control signal input section of the second selector circuit section 45. A first input section of the first selector circuit section 44 is connected to an output section 11a. A second input section of the first selector circuit section 44 is connected with an output section 11b. A third input section of the first selector circuit section 44 is connected with an output section 11c. A first input section of the second selector circuit section 45 is connected with an output section 12a. A second input section of the second selector circuit section 45 is connected with an output section 12b. A third input section of the second selector circuit section 45 is connected with an output section 12c. An output section of the first selector circuit section 44 is connected with the output section 11. An output section of the second selector circuit section 45 is connected with the output section 12.

The output section 11a is connected with the power supply voltage VDD, the drain and gate of the first NMOS transistor 5 in common. The output section 11b is connected with the source of the first NMOS transistor 5, and the drain and source of the third NMOS transistor 6a in common. The output section 11c is connected with the source of the third NMOS transistor 6a, and the drain and gate of the second NMOS transistor 6 in common.

The output section 12a is connected with the drain and gate of the second PMOS transistor 8, and a source and back gate of the third PMOS transistor 8a in common. The output section 12b is connected with the source and back gate of the first PMOS transistor 7, and a drain and gate of the third PMOS transistor 8a in common. The output section 12c is grounded and connected with the drain and gate of the first PMOS transistor 7, and the back gate of each of the first to third NMOS transistors 5, 6 and 6a in common.

Because the other configuration of the semiconductor device of the present embodiment shown in FIG. 8 is the same as that of the semiconductor device according to the first embodiment of the present invention shown in FIG. 2, the description is omitted.

An operation of the semiconductor device according to the present embodiment shown in FIG. 8 will be described. First, the amplitude control circuit section 10 operates basically in the same manner as the first to third embodiments of the present invention, although the number of MOS transistors connected in serial increases. That is, the amplitude control circuit section 10 outputs the voltages which are determined based on the power supply voltage VDD and the ratio of threshold voltages Vt5, Vt6, Vt6a, Vt7, Vt8, and Vt8a of the MOS transistors 5, 6, 6a, 7, 8, and 8a, from the output sections 11a, 11b, 11c, 12a, 12b, and 12c.

Specifically, the voltage V11a at the output section 11a, the voltage V11b at the output section 11b, the voltage V11c at the output section 11c, the voltage V12a at the output section 12a, the voltage V12b at the output section 12b, and the voltage V12c at the output section 12c are determined from the following equations:

$$V11a = VDD$$

$$V11b = VDD \times (Vt6 + Vt6a + Vt7 + Vt8 + Vt8a)/\Sigma Vt$$

$$V11c = VDD \times (Vt6 + Vt7 + Vt8 + Vt8a)/\Sigma Vt$$

$$V12a = VDD \times (Vt7 + Vt8a)/\Sigma Vt$$

$$V12b = VDD \times (Vt7)/\Sigma Vt$$

$$V12c = 0$$

Here, $\Sigma Vt = Vt5 + Vt6 + Vt6a + Vt7 + Vt8 + Vt8a$.

For example, it is supposed that the voltage V11b is a middle voltage between the voltage V11a and the voltage V11c, and the voltage V12b is a middle voltage between the voltage V12a and the voltage V12c.

Next, the control circuit section 46 generates first and second control signals based on the amplitude of the voltage outputted from the oscillation gate circuit section 20. The first selector circuit section 44 selects one of the output sections 11a, 11b and 11c based on the first control signal, and connects it with the output section 11. In the same way, the second selector circuit section 45 selects one of the nodes 12a, 12b, and 12c based on the second control signal, and connects it with the output section 12.

In the semiconductor device of the present embodiment, in the initial state, that is, before the oscillation gate circuit section 20 starts to oscillate, it is supposed that the control circuit section 46 generates the first control signal such that the first selector circuit section 44 connects the output section 11a with the output section 11. In the same way, in the initial state, it is supposed that the control circuit section 46 generates the second control signal such that the second selector circuit section 45 connects the output section 12c with the output section 12. Like the third embodiment of the present invention shown in FIG. 7, the oscillation gate circuit section 20 is supplied with the voltage which is approximately equal to the power supply voltage VDD. That is, because the high voltage is supplied to the oscillation gate circuit section 20, the oscillation can be started surely.

In the semiconductor device of the present embodiment, in the oscillation stable state, that is, while the oscillation of the oscillation gate circuit section 20 is stably sustained, it is supposed that the control circuit section 46 generates the first control signal such that the first selector circuit section 44 connects the output section 11c with the output section 11. In the same way, in the steady state, it is supposed that the control circuit section 46 generates the second control signal such that the second selector circuit section 45 connects the output section 12a with the output section 12. Thus, the voltage to be supplied to the oscillation gate circuit section 20 can be reduced, like the case of the other embodiments of the present invention.

Moreover, as one feature of the present embodiments, in the oscillation instable state in which the power supply voltage VDD falls due to some cause so that the amplitude of the voltage signal outputted from the oscillation gate circuit section 20 is reduced, it is possible to increase the voltage supplied to the oscillation gate circuit section 20 temporarily. In the oscillation instable state, it is supposed that the control circuit section 46 generates the first control signal such that the first selector circuit section 44 connects the output section 11b with the output section 11. In the same way, in the oscillation instable state, it is supposed that the control circuit section 46 generates the second control signal such that the second selector circuit section 45 connects the output section 12b with the output section 12. Thus, it is possible to return the semiconductor device to the oscillation stable state while reducing the voltage supplied to the oscillation gate circuit section 20 as much as possible.

It should be noted that in the amplitude control circuit section 10 in the present embodiment, six MOS transistors are connected in serial, but the present invention is not limited to the total number of MOS transistors. By increasing the total number of MOS transistors, the voltages applied to the output section 11 and the section 12 may be controlled finely. Thus, the minimum necessary supply voltage can be more flexibly controlled while securing the stability of the oscillation gate circuit section 20.

The features of the semiconductor device according to the first to fourth embodiments of the present invention can be freely combined in a range without technical contradiction.

What is claimed is:

1. A semiconductor device comprising:
a first power supply section configured to supply a first power supply voltage;
a second power supply section configured to supply a second power supply voltage;
an amplitude control circuit section configured to receive said first and second power supply voltages and generate first and second supply voltages; and
an oscillation circuit section configured to receive said first and second supply voltages from first and second input sections to carry out an oscillation,
wherein said amplitude control circuit section comprises:
a plurality of MOS transistors, which are connected in serial between said first and second power supply sections, and each of which is in a diode connection;
a first output section connected with one of said plurality of MOS transistors to output said first supply voltage; and
a second output section connected with another of said plurality of MOS transistors to output said second supply voltage,
wherein a back gate of at least one of said plurality of MOS transistors is connected with a source thereof.

2. A semiconductor device comprising:
a first power supply section configured to supply a first power supply voltage;
a second power supply section configured to supply a second power supply voltage;
an amplitude control circuit section configured to receive said first and second power supply voltages and generate first and second supply voltages; and an oscillation circuit section configured to receive said first and second supply voltages from first and second input sections to carry out an oscillation,
wherein said amplitude control circuit section comprises:
a plurality of MOS transistors, which are connected in serial between said first and second power supply sections, and each of which is in a diode connection;
a first output section connected with one of said plurality of MOS transistors to output said first supply voltage; and
a second output section connected with another of said plurality of OS transistors to output said second supply voltage,
wherein said plurality of MOS transistors comprises:
a first NMOS transistor connected with said first power supply section;
a first PMOS transistor connected with said second power supply section;
a second NMOS transistor connected between said first NMOS transistor and said first PMOS transistor, and connected with said first output section; and
a second PMOS transistor connected between said first PMOS transistor and said second NMOS transistor and connected with said second output section,
wherein a back gate of each of said first and second NMOS transistors is connected with said second power supply section,
wherein a back gate of said first PMOS transistor is connected with said first power supply section, and
wherein a back gate of said second PMOS transistor is connected with a source thereof.

3. The semiconductor device according to claim 2, further comprising:
a control circuit connected with an output of said oscillation circuit section and configured to generate a control signal of a first condition until oscillation of said oscillation circuit section becomes stable, and generate said control signal of a second condition while the oscillation is stable;
a first switch circuit section configured to connect said first power supply section to said first input section when said control signal is in the first condition, and connect said first output section to said first input section while said control signal is in the second condition; and
a second switch circuit section configured to connect said second power supply section to said second input section when said control signal is in the first condition, and connect said second output section to said second input section while said control signal is in the second condition.

4. The semiconductor device according to claim 2, wherein said amplitude control circuit section further comprises:
a third NMOS transistor connected between said first NMOS transistor and said second NMOS transistor;
a third output section connected with said third NMOS transistor;
a third PMOS transistor connected between said first PMOS transistor and said second PMOS transistor; and
a fourth output section connected with said third PMOS transistor,
wherein the semiconductor device further comprises:
a control circuit connected with an output of said oscillation circuit section, and configured to generate a first control signal of a first condition and a second control signal of the first condition until the oscillation of said oscillation circuit section becomes stable, and generate said first control signal of a second condition and said second control signal of the second condition while the oscillation is stable, and generate said first control signal of a third condition and said second control signal of the third condition when the oscillation is instable;
a first selector circuit section configured to connect said first power supply section with said first input section when said first control signal is in the first condition, connect said first output section with said first input section when said first control signal is in the second condition, and connect said third output section with said first input section when said first control signal is in the third condition; and
a second selector circuit section configured to connect said second power supply section with said second input section when said second control signal is in the first condition, connect said second output section with said second input section when said second control signal is in the second condition, and connect said fourth output section with said second input section when said second control signal is in the third condition.

5. A semiconductor device comprising:
a first power supply section configured to supply a first power supply voltage;
a second power supply section configured to supply a second power supply voltage;
an amplitude control circuit section configured to receive said first and second power supply voltages and generate first and second supply voltages; and
an oscillation circuit section configured to receive said first and second supply voltages from first and second input sections to carry out an oscillation,
wherein said amplitude control circuit section comprises:
a plurality of MOS transistors, which are connected in serial between said first and second power supply sections, and each of which is in a diode connection;
a first output section connected with one of said plurality of MOS transistors to output said first supply voltage; and
a second output section connected with another of said plurality of MOS transistors to output said second supply voltage,
wherein said plurality of MOS transistors comprises:
a first NMOS transistor connected with said first power supply section;
a first PMOS transistor connected with said second power supply section;
a second NMOS transistor connected between said first NMOS transistor and said first PMOS transistor and connected with said first output section; and
a second PMOS transistor connected between said first PMOS transistor and said second NMOS transistor and connected with said second output section,
wherein a back gate of each of said first and second PMOS transistors is connected with said first power supply section,
wherein a back gate of said first NMOS transistor is connected with said second power supply section, and
wherein a back gate of said second NMOS transistor is connected with a source thereof.

6. A semiconductor device comprising:
a first power supply section configured to supply a first power supply voltage;
a second power supply section configured to supply a second power supply voltage;
an amplitude control circuit section configured to receive said first and second power supply voltages and generate first and second supply voltages; and an oscillation circuit section configured to receive said first and second supply voltages from first and second input sections to carry out an oscillation, wherein said amplitude control circuit section comprises:

a plurality of MOS transistors, which are connected in serial between said first and second power supply sections, and each of which is in a diode connection;

a first output section connected with one of said plurality of MOS transistors to output said first supply voltage; and a second output section connected with another of said plurality of MOS transistors to output said second supply voltage, wherein said amplitude control circuit section further comprises:

a first switch circuit section configured to supply said first power supply voltage to said first input section until oscillation of said oscillation circuit section becomes stable, and supply said first supply voltage to said first input section while the oscillation is stable; and a second switch circuit section configured to supply said second power supply voltage to said second input section until the oscillation becomes stable, and supply said second supply voltage to said second input section while the oscillation is stable.

7. The semiconductor device according to claim 6, wherein said amplitude control circuit section further comprises:

a third output section configured to output a third supply voltage between said first power supply voltage and said first supply voltage; and a fourth output section configured to output a fourth supply voltage between said second power supply voltage and said second supply voltage, wherein said first switch circuit section supplies said third supply voltage to said first input section when the oscillation is instable, and wherein said second switch circuit section supplies said fourth supply voltage to said second input section when the oscillation is instable.

* * * * *